United States Patent [19]
Hasegawa et al.

[11] Patent Number: 5,373,200
[45] Date of Patent: Dec. 13, 1994

[54] SEMICONDUCTOR INTEGRATED CIRCUIT

[75] Inventors: Takehiro Hasegawa, Tokyo; Atsushi Kameyama, Yokohama, both of Japan

[73] Assignee: Kabushiki Kaisha Toshiba, Kawasaki, Japan

[21] Appl. No.: 214,678

[22] Filed: Mar. 21, 1994

Related U.S. Application Data

[63] Continuation of Ser. No. 815,043, Dec. 31, 1991, abandoned.

[30] Foreign Application Priority Data

Jan. 25, 1991 [JP] Japan .................. 3-025549

[51] Int. Cl.$^5$ .................. H03K 5/13; H03K 19/20
[52] U.S. Cl. .................. 327/218; 326/93; 326/103; 327/392
[58] Field of Search .......... 307/272.1–272.2, 307/445, 593, 595, 608, 263

[56] References Cited

U.S. PATENT DOCUMENTS

| | | | |
|---|---|---|---|
| 4,282,488 | 8/1981 | Norman et al. | 307/608 |
| 4,314,164 | 2/1982 | Tin et al. | 307/243 |
| 4,475,049 | 10/1984 | Smith et al. | 307/242 |
| 4,873,456 | 10/1989 | Olisar et al. | |

FOREIGN PATENT DOCUMENTS

| | | |
|---|---|---|
| 0213647 | 3/1987 | European Pat. Off. |
| 0492943 | 7/1992 | European Pat. Off. |
| 3044835 | 3/1982 | Germany |
| 3813550 | 3/1989 | Germany |
| 0134620 | 7/1985 | Japan .................. 307/272.1 |

OTHER PUBLICATIONS

"High Speed GaAs Integrated Circuits", by Steven I. Long, et al pp. 20–30. Proceedings of the IEEE vol. 70, No. 1, Jan. 1982.

"Divide by 128/129 5 mW 400 MHz Band GaAs prescaler IC", by Y. Kamatani, et al, pp. 179–182. GaAs Ic Symposium IEEE 1985.

*Primary Examiner*—Margaret Rose Wambach
*Attorney, Agent, or Firm*—Oblon, Spivak, McClelland, Maier & Neustadt

[57] ABSTRACT

A semiconductor integrated circuit according to this invention is characterized by comprising a flip-flop having input terminal means and output terminal means, at least one input gate means having output terminal means connected to the input terminal means, which supplies data to this input terminal means under the control of clock, and at least one output buffer means having input terminal means connected to the output terminal means, to which the output signal of the flip-flop is supplied and which is connected to the output terminal means of the input gate means to receive the data from this input gate means to provide an advance read function.

13 Claims, 13 Drawing Sheets

SEMICONDUCTOR INTEGRATED CIRCUIT

This application is a continuation of Ser. No 07/815,043, filed on Dec. 31, 1991, now abandoned.

BACKGROUND OF THE INVENTION

1. Field of the Invention

This invention relates to a semiconductor integrated circuit composed of flip-flops, which receives data with the timing of a clock signal and retains it.

2. Description of the Related Art

Figure 1A:
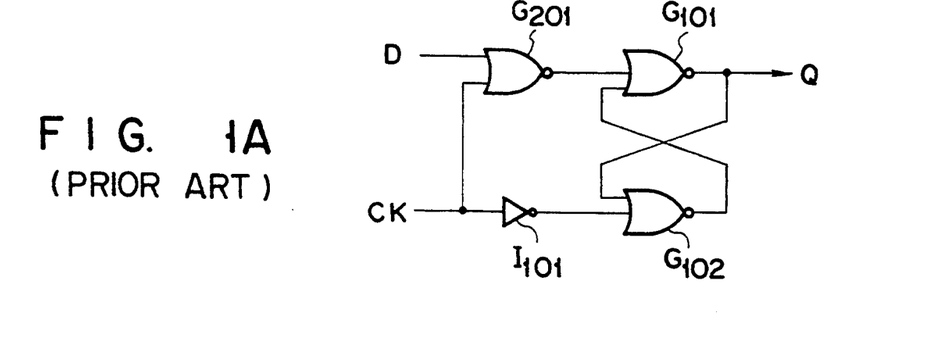
FIGS. 1A to 1C are circuit diagrams for various types of conventional semiconductor integrated circuits.

Conventional data latch circuits are constructed as shown in FIG. 1A, for example. They are composed primarily of flip-flops using NOR gates. Specifically, the data latch circuit is made up of NOR gates $G_{101}$ and $G_{102}$ constituting a flip-flop, a NOR gate $G_{201}$ serving as an input gate that transfers data D to one input terminal of the flip-flop under the control of clock CK supplied to one input terminal of this gate, and an inverter $I_{101}$ that inverts clock CK and supplies it to the other input terminal of the flip-flop.

Figure 1B:
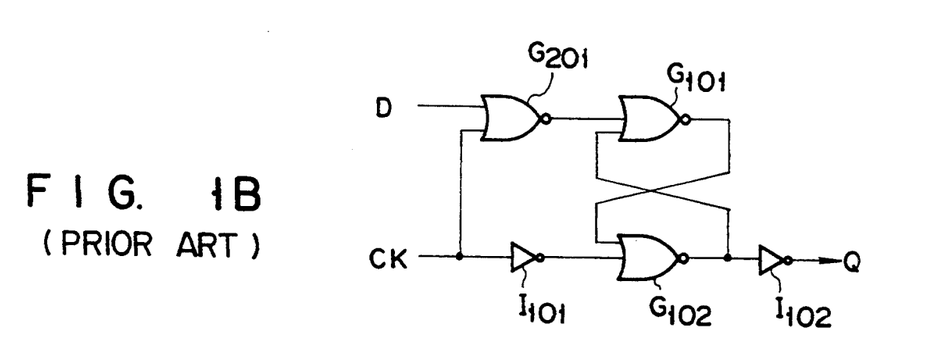

To increase the current driving capacity of the data latch, for example, an inverter buffer $I_{102}$ is provided as an output buffer as shown FIG. 1B. In the FIG. 1B data latch circuit with the output buffer, data taken in on clock has to pass through three stages of gate $G_{101}$, gate $G_{102}$, and inverter buffer $I_{102}$ before it reaches the output terminal. This delays the data transfer between the input and output in the data latch circuit.

Figure 1C:
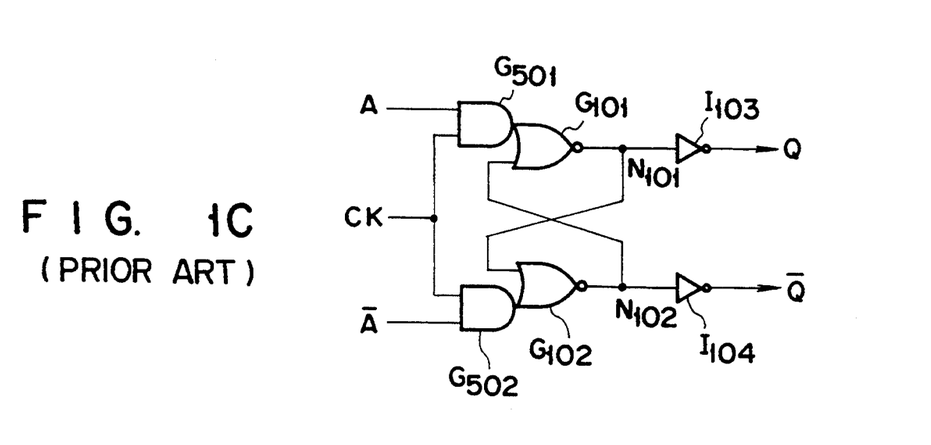
Figure 2:
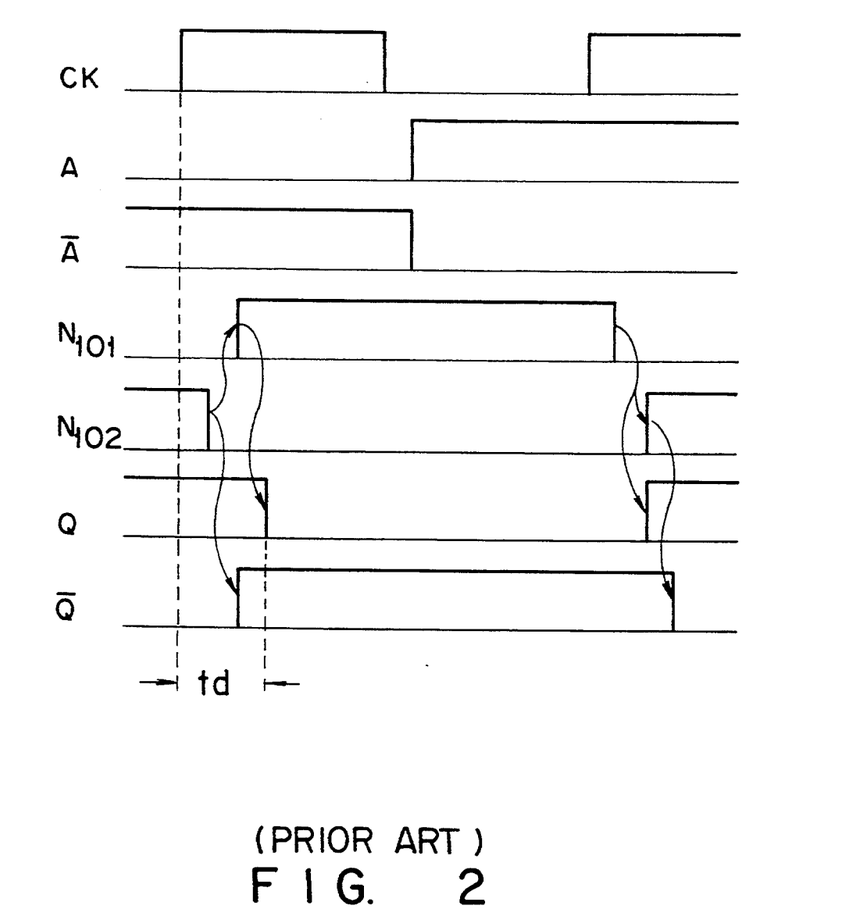
FIG. 2 is a timing chart for explaining the operation of the flip-flop of FIG. 1C.

FIG. 1C shows another conventional flip-flop circuit, which is composed of NOR gates $G_{101}$ and $G_{102}$ constituting a flip-flop stage, AND gates $G_{501}$ and $G_{502}$ serving as input gates, and inverter buffers $I_{103}$ and $I_{104}$ serving as output buffers. Like the FIG. 1B data latch circuit, this flip-flop circuit also has a data delay due to three gate stages. Data delay will be explained, referring to the timing chart in FIG. 2. Assume that while data output Q is in the "1" state and the inverse data output of Q, /Q is in the "0" state, data consisting of A="0" and /A="1" is supplied. Here, to cause the input data to appear at the output Q, it is necessary for data /A to cause the output node $N_{102}$ of NOR gate $G_{102}$ to change from "1" to "0", which then causes the output node $N_{101}$ of NOR gate $G_{101}$ to change from "0" to "1", thereby changing the output of inverter buffer $I_{103}$ from "1" to "0". Therefore, data must pass through three gates, NOR gates $G_{102}$ and $G_{101}$, and inverter buffer $I_{103}$.

The same is true for D flip-flop circuits and the slave stage of master-slave flip-flop circuits.

As noted above, in various types of conventional flip-flop and data latch circuits, there is a delay introduced by three stages of gates from when data is supplied to the flip-flop stage and when it appears at the output terminal of the output buffer. Such a delay has been an obstacle to faster data processing.

For technical literature related to the present invention, reference may be made to Steven I. Long et al., "High Speed GaAs Integrated Circuits," Proceeding of The IEEE, Vol. 70, No. 1, January 1982, pp. 20–30 and Y. Kamatani et al.,"DIVIDE BY 128/129 5 mW 400 MHz BAND GaAs PRESCALER IC," IEEE, 1985, GaAs IC Symposium, pp. 179-182.

SUMMARY OF THE INVENTION

The object of the present invention is to provide an improved semiconductor integrated circuit, particularly a flip-flop-based semiconductor integrated circuit capable of high-speed operation.

The foregoing object is accomplished by providing a semiconductor integrated circuit comprising: a flip-flop having input terminal means and output terminal means; at least one input gate means having output terminal means connected to the input terminal means, which supplies data to this input terminal under the control of clock; and at least one output buffer means the input terminal means of which is connected to the output terminal means of the flip-flop to receive the output signal of the flip-flop and which is connected to the output terminal means of the input gate means to receive the data from the input gate means to provide an advance read function.

With this configuration, the output buffer is provided with an advance read function, thereby eliminating a delay due to two stages of gates of the flip-flop in transferring data to the output terminal. This approach has no adverse effect on the data retaining function of the flip-flop stage. Consequently, the present invention provides various types of flip-flop circuits and data latch circuits with very small data delays.

In this way, providing the output buffer with an advance read function eliminates the adverse effects of the internal delays in various types of flip-flop circuits and data latch circuits, which helps make semiconductor integrated circuits operate faster.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Referring to the accompanying drawings, embodiments of the present invention will be explained.

Figure 3:
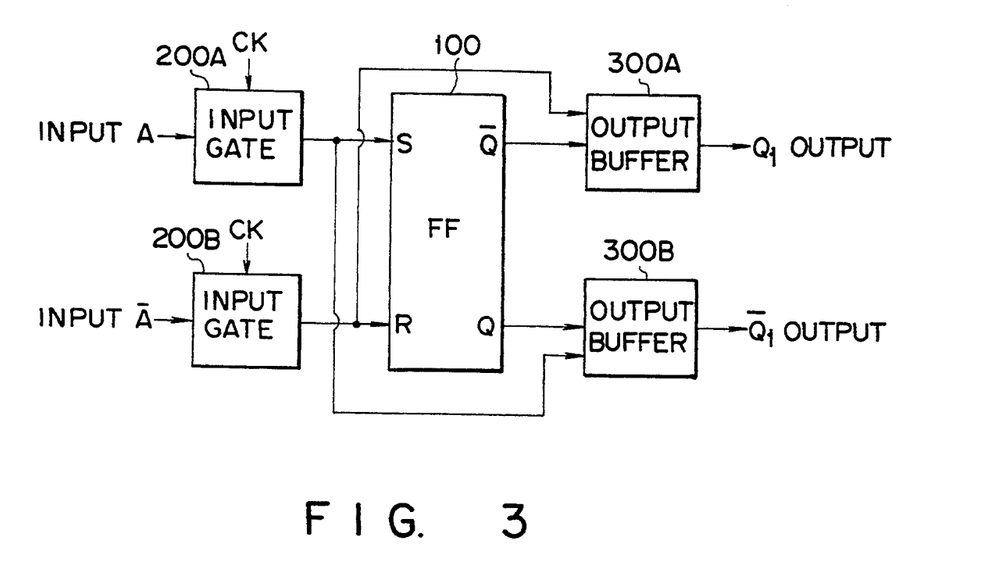
FIG. 3 is a block diagram for a first embodiment of the RS flip-flop having an input gate according to the present invention.

FIG. 3 is a block diagram for a first embodiment of the RS flip-flop circuit having an input gate according to the present invention. The set input terminal S and reset input terminal R of an RS flip-flop 100 are provided respectively with input gates 200A and 200B, which transfer input data under the control of clock CK. The set output terminal Q and reset output terminal /Q are provided with output buffers 300B and 300A, respectively. The output buffer 300B is supplied with the data from the set output terminal Q and the data supplied to the set input terminal S. That is, the data to the set input terminal S is supplied to the output buffer 300B prior being transferred through the flip-flop 100, to provide the buffer with an advance read function. Similarly, the output buffer 300A, like the output buffer 300B, is supplied with the data from the reset output terminal /Q and the data supplied to the reset input terminal R.

Figure 4:
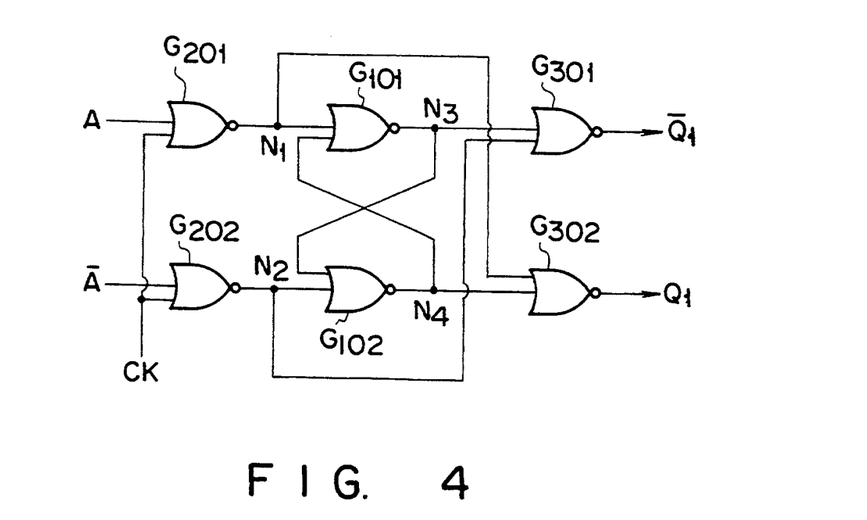
FIG. 4 is a circuit diagram for the flip-flop circuit of FIG. 3.

FIG. 4 is a circuit diagram for the flip-flop circuit of FIG. 3. The RS flip-flop 100 is made up of two NOR gates $G_{101}$ and $G_{102}$. The input gates 200A and 200B are composed of NOR gates $G_{201}$ and $G_{202}$, respectively. The output buffer 300A and 300B are composed of NOR gates $G_{301}$ and $G_{302}$. One NOR gate $G_{301}$ of the output buffer stage is connected to the output node $N_3$ of the flip-flop stage and the input node $N_2$. The other NOR gate $G_{302}$ of the output buffer stage is connected to the output node $N_4$ of the flip-flop stage and the input node $N_1$.

Figure 5:
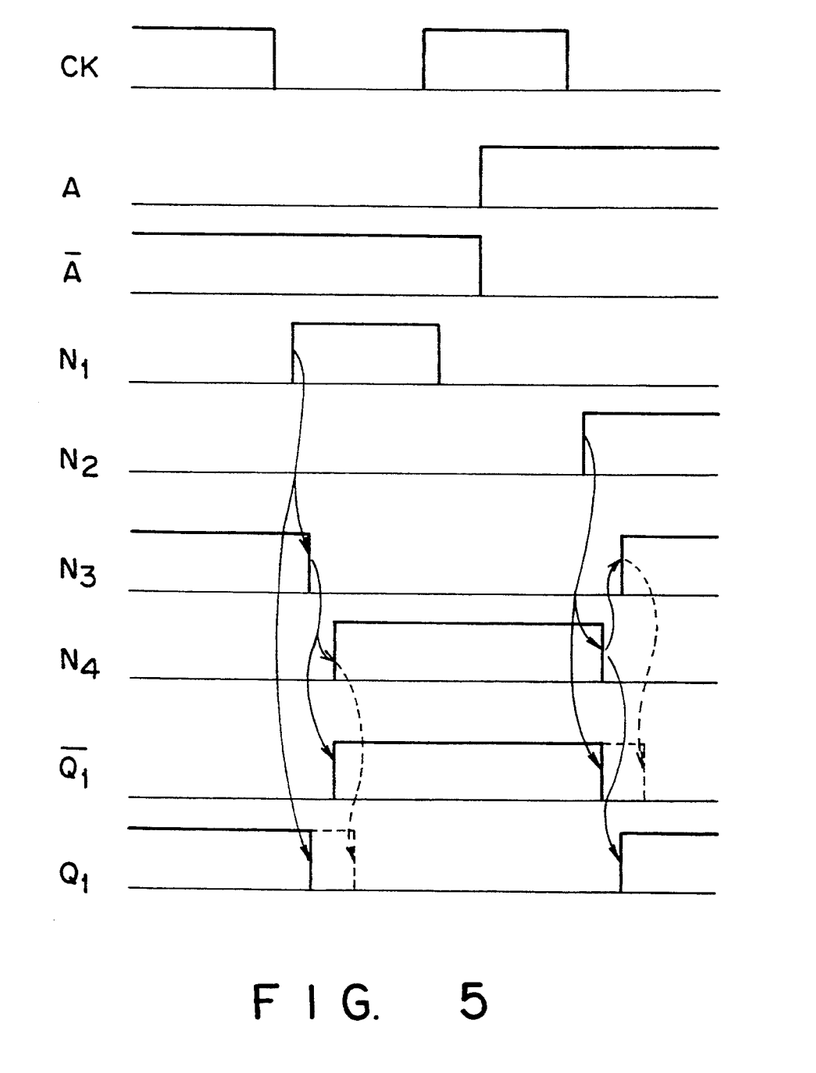
FIG. 5 is a timing chart for explaining the operation of the flip-flop of FIG. 4.

FIG. 5 is a timing chart for explaining the operation of the flip-flop circuit of FIG. 4. It is assumed that in the initial state, clock CK is a "1", data A is a "038, data /A is a "1", nodes $N_1$ and $N_2$ are a "038, $N_3$ is a "1", $N_4$ is a "038, output $Q_1$ is a "1", and output $/Q_1$ is a "0". The change of clock CK from "1" to "0" causes node $N_1$ to change from "0" to "1". This change at node $N_1$ then causes the voltage at the output node $N_3$ of NOR gate $G_{101}$ to fall. This falling voltage at the output node $N_3$ in turn causes the voltage at the output node $N_4$ of NOR gate $G_{102}$ to rise. In conventional output buffers without an advance read function, as shown by broken lines in FIG. 5, as a result of the rising signal from the output node $N_4$, the output $Q_1$ of NOR gate $G_{302}$ of the output buffer stage goes to "0". In the present embodiment, however, as shown by solid lines, a rise in the voltage at input node $N_1$ is supplied directly to NOR gate $G_{302}$ of the output buffer stage, which causes the output $Q_1$ to fall. Therefore, the final output $Q_1$ = "0" can be obtained without introducing a delay due to two NOR gates $G_{101}$ and $G_{102}$ constituting the RS flip-flop circuit 100. The same is true in a case where the input data of A = "1" and /A = "0" is taken in on clock CK and retained. Here, the final output $/Q_1$ = "0" is obtained without a delay due to two NOR gates found in conventional circuits.

Figure 6:
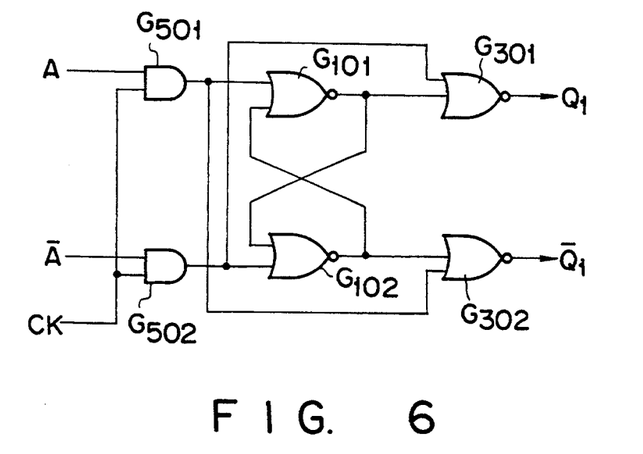
FIG. 6 is a circuit diagram for a modification of the flip-flop of FIG. 4.

FIG. 6 is a circuit diagram for a modification of the flip-flop circuit of FIG. 4. In this circuit, AND gates $G_{501}$ and $G_{502}$ replace the NOR gates $G_{201}$ and $G_{202}$ constituting the input gate of FIG. 4. The AND gate $G_{501}$ and $G_{502}$ may be such as source-follower AND gates.

Figure 7:
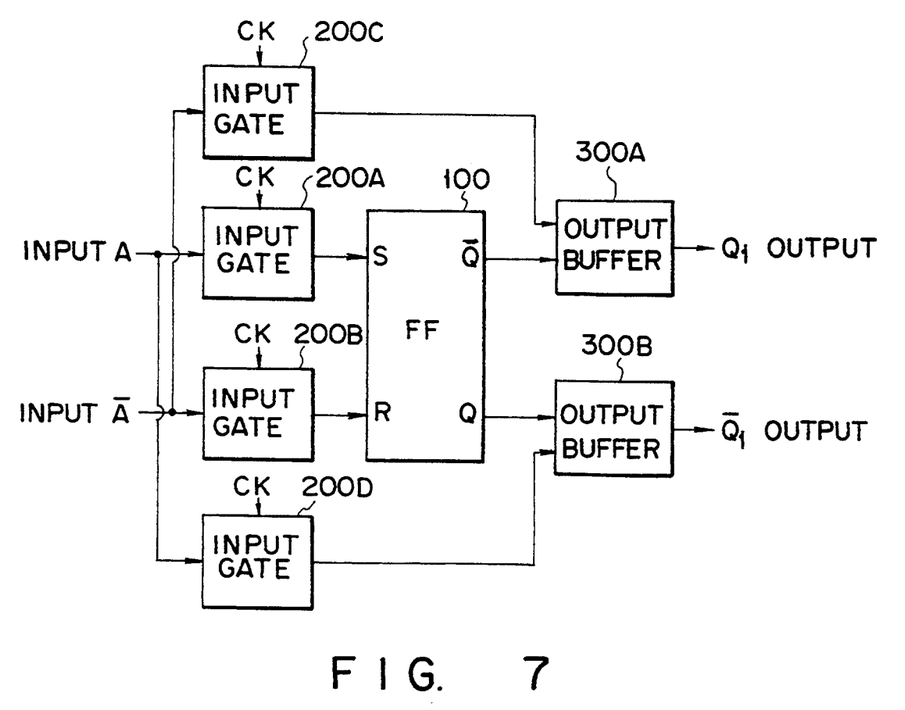
FIG. 7 is a block diagram for a second embodiment of the RS flip-flop having an input gate according to the present invention.

FIG. 7 is a block diagram for a second embodiment of the RS flip-flop circuit having an input gate according to the present invention. In this embodiment, in addition to the input gates 200A and 200B for transferring data to the RS flip-flop 100, input gates 200C and 200D are provided to give the output buffers 300A and 300B an advance read function. In this embodiment, the composite gate arrangement of the input gates 200A and 200B and RS flip-flop 100 is useful particularly in cases where the set input terminal S and reset input terminal R cannot be connected directly to the output buffers 300B and 300A.

Figure 8:
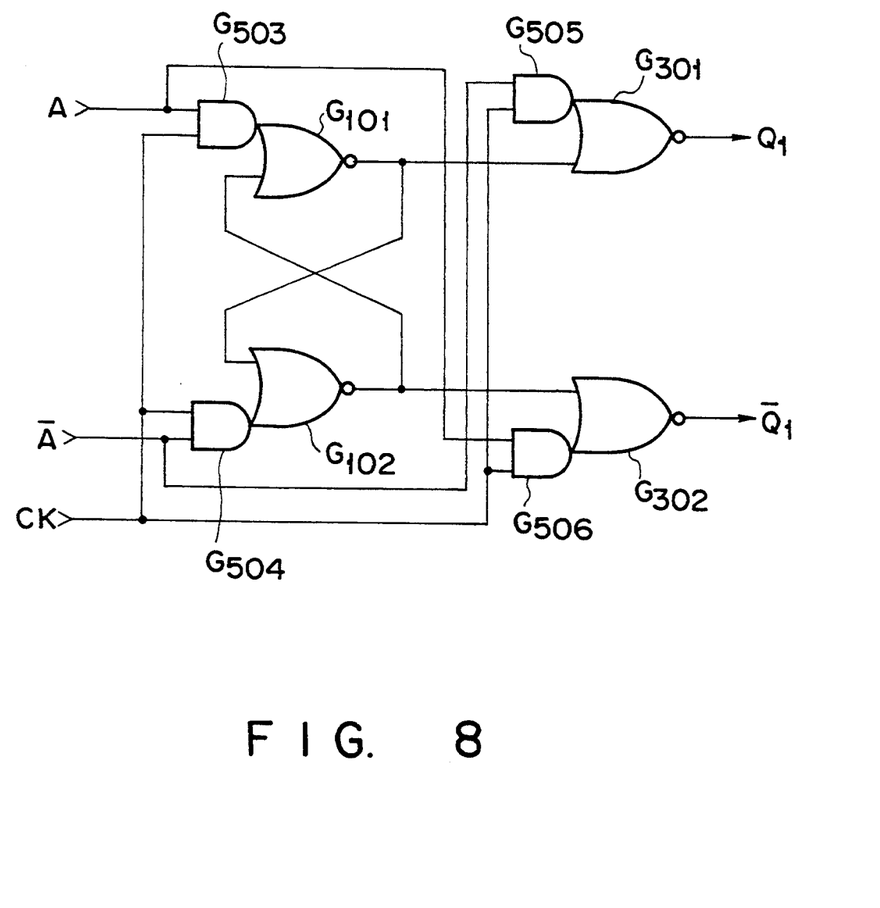
FIG. 8 is a circuit diagram for the flip-flop circuit of FIG. 7.

FIG. 8 is a circuit diagram for the RS flip-flop circuit of FIG. 7. In this circuit, NOR gates $G_{101}$ and $G_{102}$ constitute the RS flip-flop circuit 100. In the input gates 200A and 200B, AND gates $G_{503}$ and $G_{504}$ are combined with NOR gates $G_{101}$ and $G_{102}$, respectively, to form composite gates. AND gates $G_{505}$ and $G_{506}$, which provide an advance read function for NOR gates $G_{301}$ and $G_{302}$ constituting the output buffers 300A and 300B, correspond to the input gates 200C and 200D, respectively. In this way, the output buffer section is also constructed to form a composite gate arrangement of AND and NOR elements.

Figure 9A:
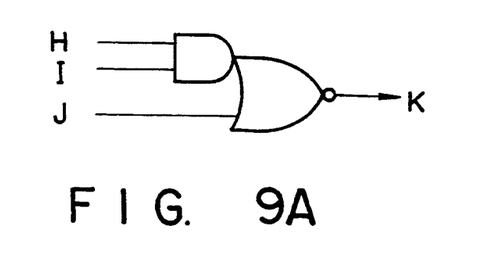
FIGS. 9A to 9C are circuit diagrams for the composite gates of FIG. 8.
Figure 9B:
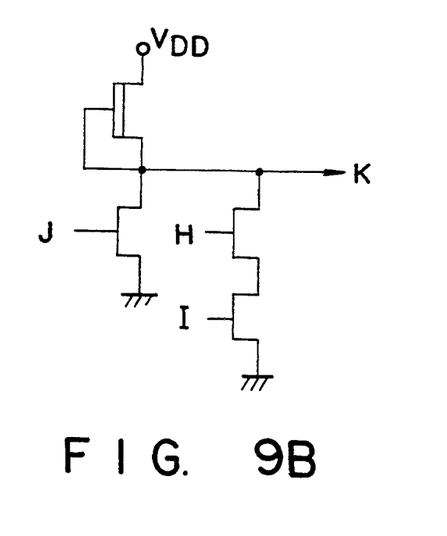
Figure 9C:
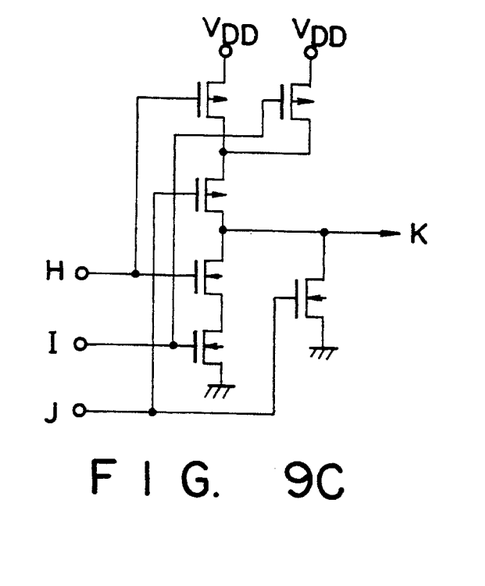

Examples of the AND-to-NOR composite gate arrangement of FIG. 8 are shown in FIG. 9A to 9C. FIG. 9A illustrates an equivalent circuit of gate level, FIG. 9B shows a circuit diagram for the FIG. 9A circuit constructed of MESFETs, and FIG. 9C depicts a circuit diagram for FIG. 9A circuit constructed of CMOS circuits.

FIGS. 10 to 16 illustrate embodiments where the present invention is applied to a data latch circuit.

Figure 10:
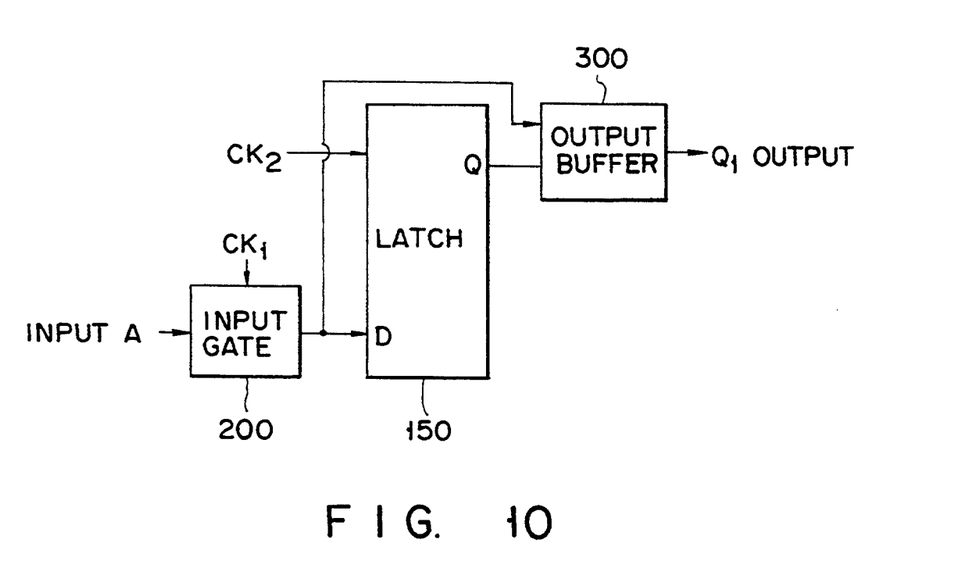
FIG. 10 is a block diagram for a first embodiment of the data latch circuit according to the present invention.

FIG. 10 is a block diagram for a first embodiment of the data latch circuit according to the present invention. A flip-flop 150 for latching data has the data input terminal D, the input terminal for clock $CK_2$, and the output terminal Q. The data input terminal D is connected to an input gate 200 that transfers input data under the control of clock $CK_1$. The data output terminal Q is connected to an output buffer 300. In this embodiment, like the above embodiment, the output buffer 300 is provided with an advance read function that allows the input data to be supplied directly to this buffer before the input passing through the data-latch flip-flop 150. Therefore, as with the above embodiment, the present embodiment provides the output without introducing a delay due to two stages of gates of the data-latch flip-flop 150.

Figure 11:
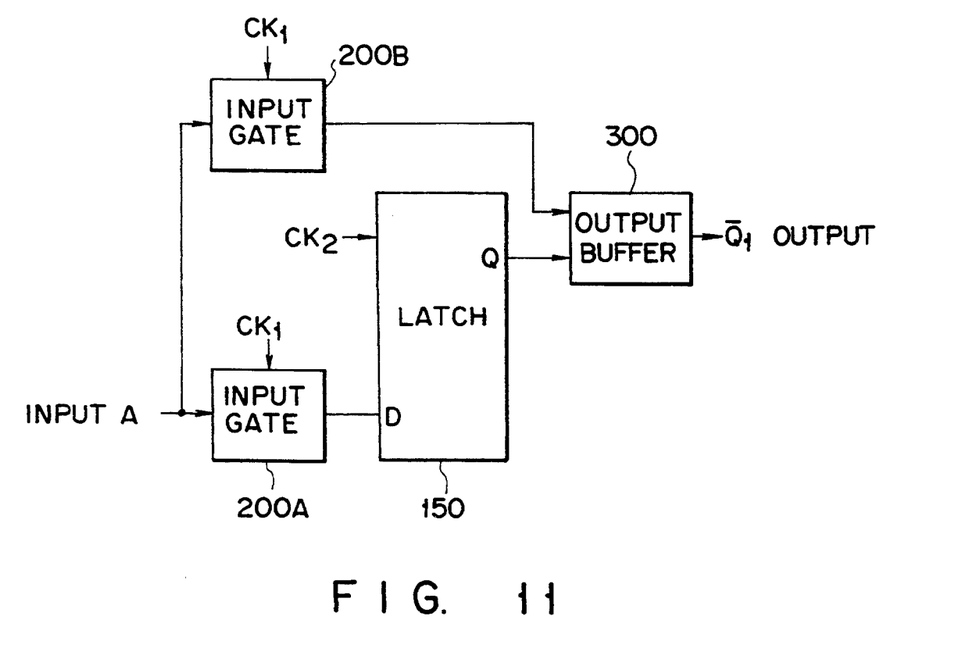
FIG. 11 is a block diagram for a second embodiment of the data latch circuit according to the present invention.

FIG. 11 is a block diagram for a second embodiment of the data latch circuit according to the present invention. In this embodiment, another input gate 200B is provided in parallel with the input gate 200A to give the output buffer 300 an advance read function. The present embodiment, like the embodiment explained in FIG. 7, is useful for composite gate arrangements.

Figure 12:
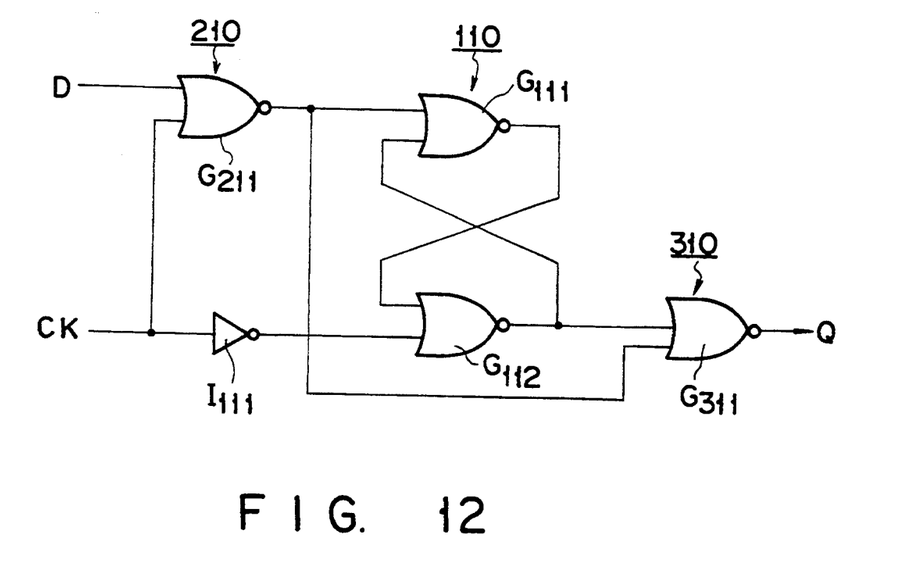
FIG. 12 is a circuit diagram for a third embodiment of the data latch circuit according to the present invention.

FIG. 12 is a block diagram for a third embodiment of the data latch circuit according to the present invention. The data latch circuit of FIG. 12 is made up of a NOR gate $G_{211}$ forming the input gate stage 210, NOR gates $G_{111}$ and $G_{112}$ constituting a flip-flop stage 110, and a NOR gate $G_{311}$ forming the output buffer stage 310. The clock CK is supplied directly to the NOR gate $G_{211}$ of the input gate stage 210, and at the same time, is supplied via an inverter gate $I_{111}$ to the NOR gate $G_{112}$ of the flip-flop stage. Unlike ordinary data latch circuits, in the present embodiment, the signal at the output node of the input gate stage 210 is supplied to the NOR gate $G_{311}$ of the output buffer 310 to provide an advance read function.

Figure 13:
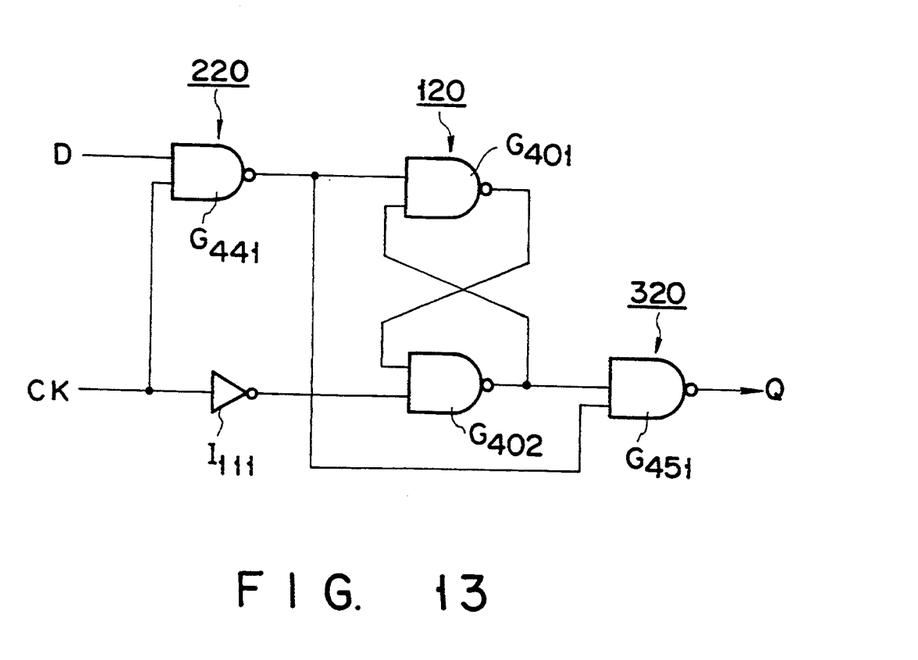
FIG. 13 is a circuit diagram for a fourth embodiment of the data latch circuit according to the present invention.

FIG. 13 is a block diagram for a fourth embodiment of the data latch circuit according to the present invention. The data latch circuit of FIG. 13 is composed of a NAND gate $G_{441}$ forming the input gate stage 220, NAND gates $G_{401}$ and $G_{402}$ constituting the flip-flop stage 120, and a NAND gate $G_{451}$ forming the output buffer stage 320. The clock CK is supplied directly to the NAND gate $G_{441}$ of the input gate stage 220, and at the same time, is supplied via the inverter gate $I_{111}$ to the NOR gate $G_{402}$ of the flip-flop stage. Unlike ordinary data latch circuits, the present embodiment allows the signal at the output node of the input gate stage 220 to be supplied to the NAND gate $G_{451}$ of the output buffer 320 to provide an advance read function.

Figure 14:
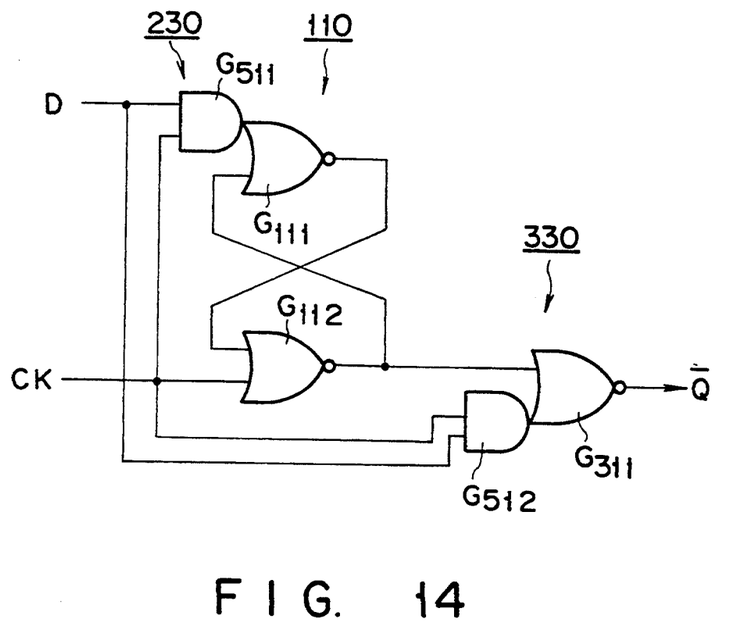
FIG. 14 is a circuit diagram for a fifth embodiment of the data latch circuit according to the present invention.

FIG. 14 is a block diagram for a fifth embodiment of the data latch circuit according to the present invention. In the data latch circuit of FIG. 14, the flip-flop stage 110 is made up of NOR gates $G_{111}$ and $G_{112}$. The NOR gate $G_{111}$ and an AND gate $G_{511}$ forming the input gate stage 230 are combined to form an AND-to-NOR composite gate arrangement. The output buffer stage 330 is made up of the NOR gate $G_{311}$. The NOR gate $G_{311}$ and an AND gate $G_{512}$ are combined to form a composite gate arrangement to provide the output buffer 330 with an advance read function.

Figure 15:
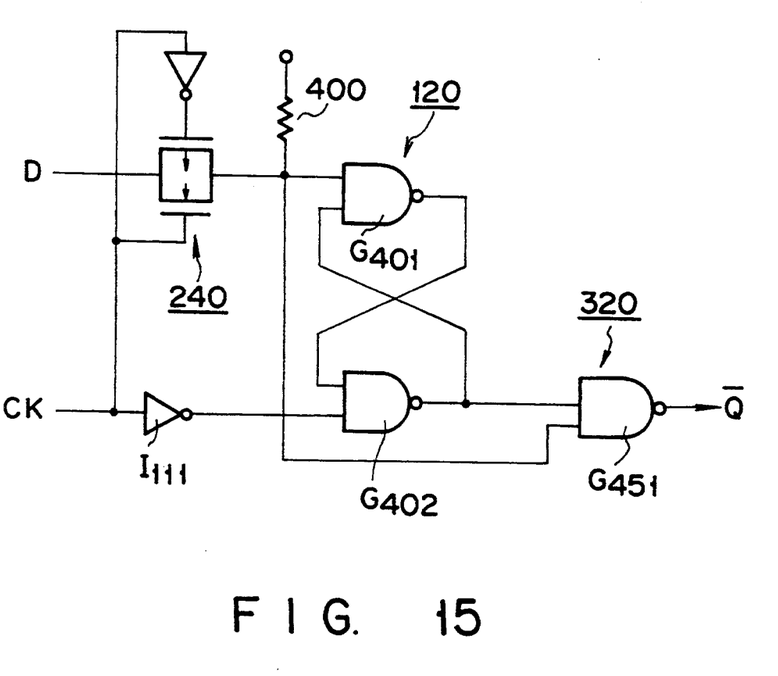
FIG. 15 is a circuit diagram for a sixth embodiment of the data latch circuit according to the present invention.

FIG. 15 is a block diagram for a sixth embodiment of the data latch circuit according to the present invention. In the data latch circuit of FIG. 15, the input gate stage 220 of FIG. 13 is constructed of a CMOS transfer gate 240. The resistor 400 is designed to present enough resistance for the output node of the transfer gate 220 to go to the "1" level only when the transfer gate 240 turns off.

Figure 16:
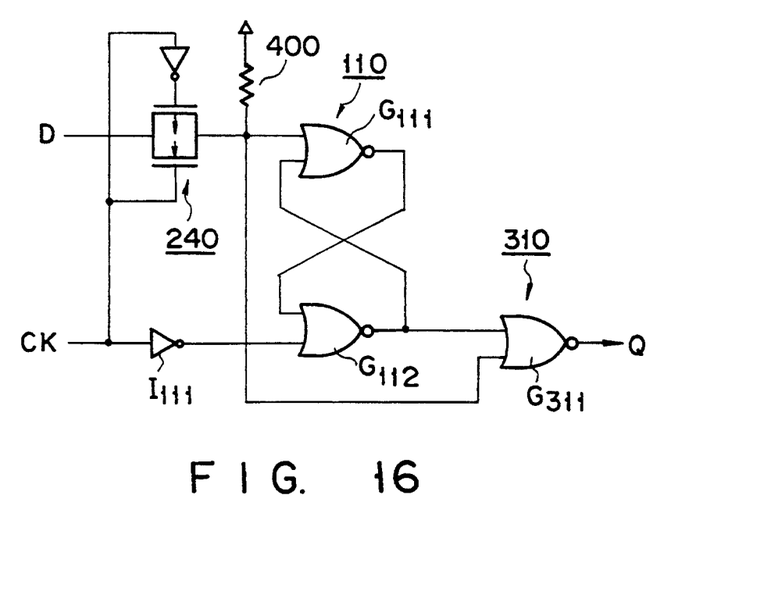
FIG. 16 is a circuit diagram for a seventh embodiment of the data latch circuit according to the present invention.

FIG. 16 is a block diagram for a seventh embodiment of the data latch circuit according to the present invention. In the data latch circuit of FIG. 16, the input gate stage 230 of FIG. 14 is constructed of a CMOS transfer gate 240. With this configuration, because the output node of the input gate 230 can be connected to the output buffer, this provides an advance read function without the AND gate $G_{512}$ of FIG. 14. The resistor 400 is designed to present enough resistance for the output node of the transfer gate 240 to go to the "0" level only when the transfer gate turns off, and to maintain the node potential.

The data latch circuits shown in FIGS. 10 to 16, like the above-described embodiments, eliminate the effects of internal delay and enable high speed operation.

Figure 17:
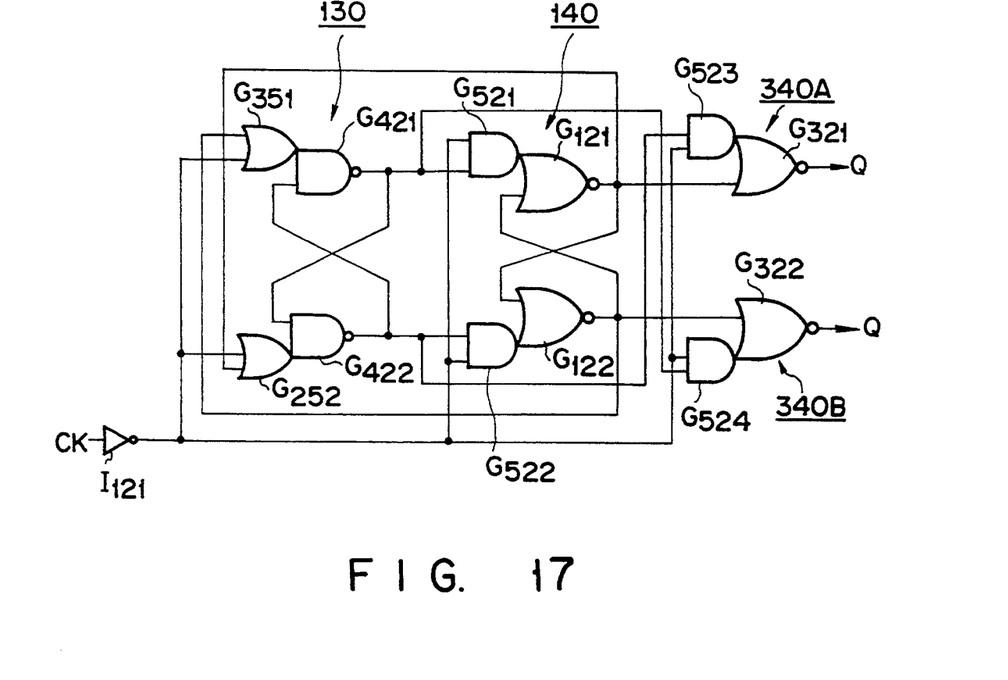
FIG. 17 is a circuit diagram for a first embodiment of the master-slave flip-flop according to the present invention.

FIG. 17 is a circuit diagram for a first embodiment of the master-slave flip-flop circuit according to the present invention. The master flip-flop stage 130 is composed of NAND gates $G_{421}$ and $G_{422}$ constituting a flip-flop and OR gates $G_{351}$ and $G_{352}$ forming transfer gates, all of which are integrated into an OR-to-NAND composite arrangement. The slave flip-flop stage 140 is composed of NOR gates $G_{121}$ and $G_{122}$ constituting a flip-flop and AND gates $G_{521}$ and $G_{522}$ forming transfer gates, all of which are integrated into a NAND-to-NOR composite arrangement. The output buffers 340A and 340B each consist of AND-to-NOR composite gates, into which NOR gates $G_{321}$ and $G_{322}$ and AND gates $G_{523}$ and $G_{524}$ for providing an advance read function are integrated, respectively.

In this embodiment, like the preceding embodiment, while data is still in the course of passing through the slave flip-flop stage 140, the AND gates $G_{523}$ and $G_{524}$ allow a change in the signal at the output node of the master flip-flop stage 130 to appear at the output buffers 340A and 340B as a change in the output, thereby shortening data delay.

Figure 18:
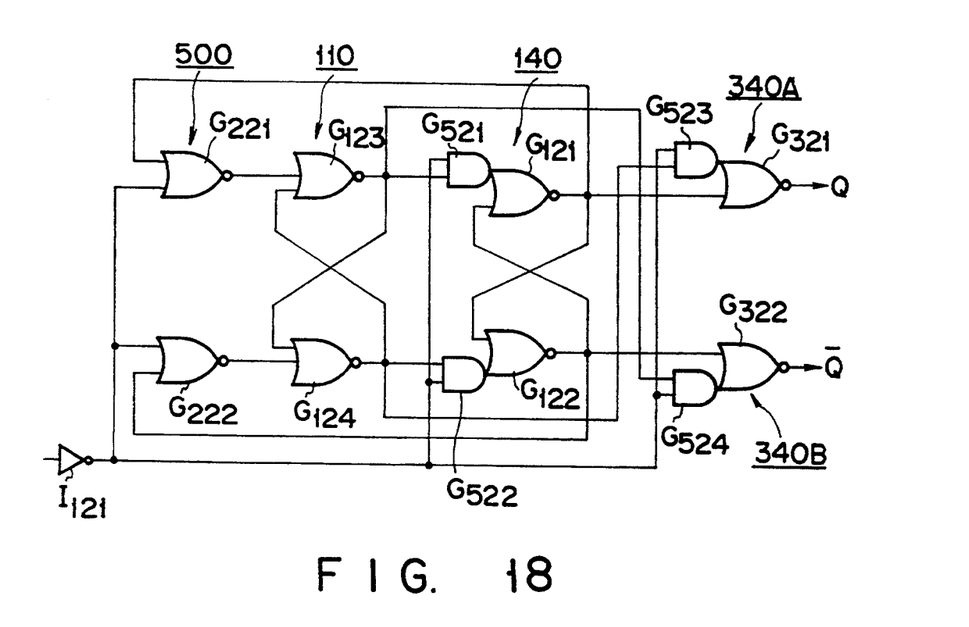
FIG. 18 is a circuit diagram for a second embodiment of the master-slave flip-flop according to the present invention.

FIG. 18 is a circuit diagram for a second embodiment of the master-slave flip-flop circuit according to the present invention. In the master-slave flip-flop circuit of FIG. 18, the master stage is composed of the master flip-flop 110 consisting of NOR gates $G_{123}$ and $G_{124}$ and a separate transfer gate 500 consisting of NOR gates $G_{221}$ and $G_{222}$.

Figure 19:
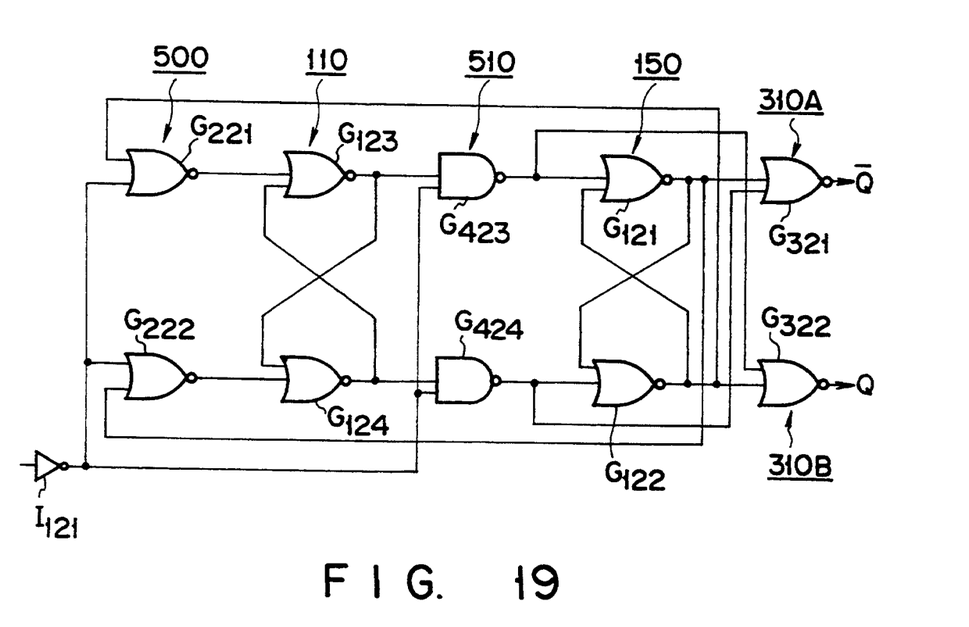
FIG. 19 is a circuit diagram for a third embodiment of the master-slave flip-flop according to the present invention.

FIG. 19 is a circuit diagram for a third embodiment of the master-slave flip-flop circuit according to the present invention. In the master-slave flip-flop circuit of FIG. 19, the master-slave flip-flop circuit of FIG. 18 is modified in that the slave stage is also composed of the flip-flop 150 consisting of NOR gates $G_{121}$ and $G_{122}$ and a separate transfer gate 510 consisting Of NAND gates $G_{423}$ and $G_{424}$. Here, the output buffers 310A and 310B consist only of NOR gates $G_{321}$ and $G_{322}$, respectively. The output nodes of the NAND gates $G_{423}$ and $G_{424}$ of the transfer gate stage 510 are connected to the output buffers 310B and 310A, respectively, to provide these buffers with an advance read function.

Figure 20:
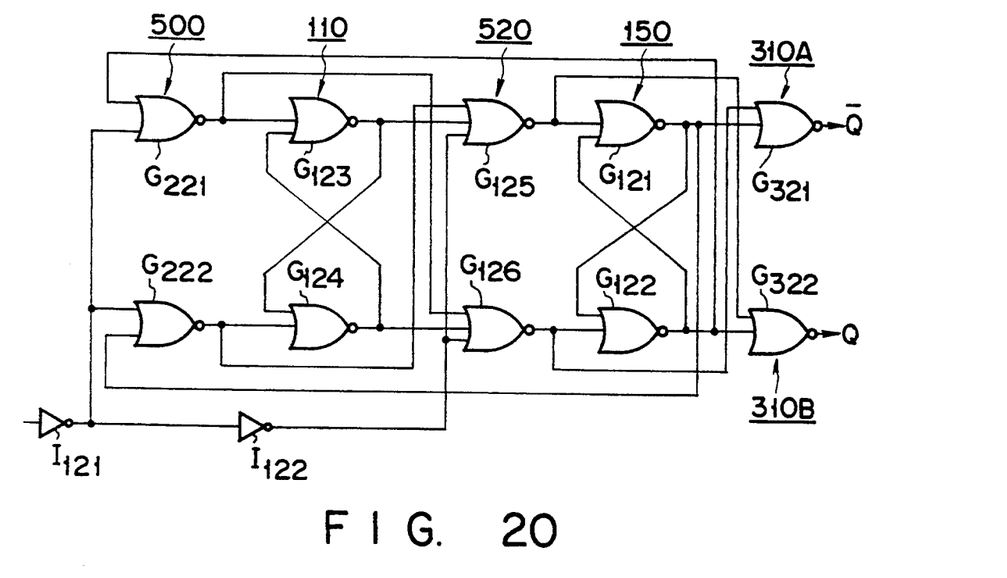
FIG. 20 is a circuit diagram for a fourth embodiment of the master-slave flip-flop according to the present invention.

FIG. 20 is a circuit diagram for a fourth embodiment of the master-slave flip-flop circuit according to the present invention. In the master-slave flip-flop circuit of FIG. 20, the NAND gates of the transfer gate stage 510 of the master-slave flip-flop circuit of FIG. 19 is replaced by NOR gates $G_{125}$ and $G_{126}$, which forms the transfer gate stage 520.

Figure 21:
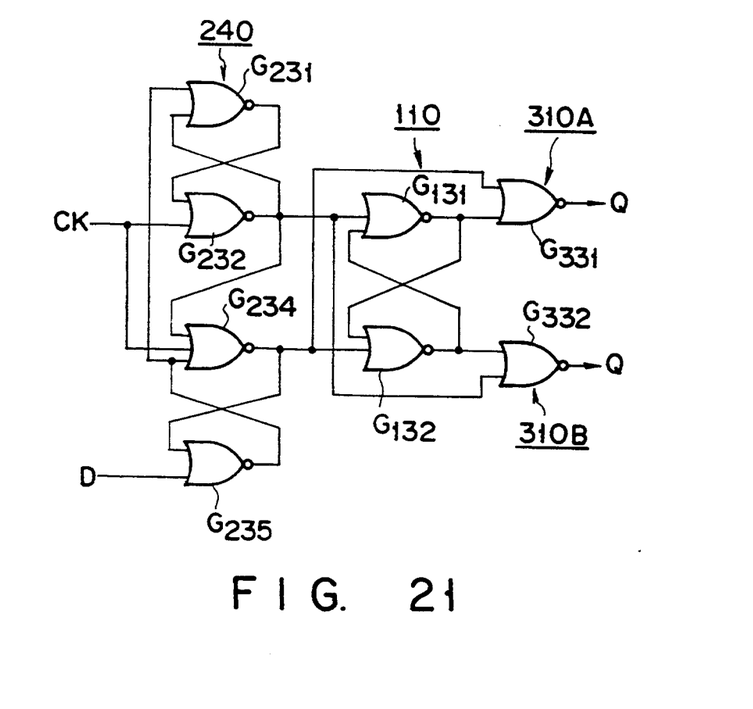
FIG. 21 is a circuit diagram for an embodiment of the D flip-flop according to the present invention.

FIG. 21 is an embodiment of the D flip-flop according to the present invention. The input gate stage 240 is composed of NOR gates $G_{231}$, $G_{232}$, $G_{234}$, and $G_{235}$, the flip-flop stage 110 is made up of NOR gates $G_{131}$ and $G_{132}$, and the output buffers 310A and 310B consist of NOR gates $G_{331}$ and $G_{332}$, respectively. This D flip-flop differs from ordinary D flip-flops in that the output nodes of the input gate stage 240 are connected to the output buffers 310A and 310B to provide these buffers with an advance read function. Consequently, this embodiment also achieves shorter data delay.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A semiconductor integrated circuit comprising:
   a flip-flop having input terminals and output terminals;
   at least one input gate means having an output terminal coupled with one of said input terminals of said flip-flop, for supplying data to one of said input terminals of said flip-flop under the control of a clock; and
   at least one output buffer means having an input terminal which is directly connected only to one of said output terminals of said flip-flop and said output terminal of said input gate means, for receiving an output signal output from said one output terminal of said flip-flop and data directly supplied from one of said input gate means, thereby providing an advance read function.

2. A semiconductor integrated circuit according to claim 1, wherein
   said input terminal means of said flip-flop contains a set input terminal and a reset input terminal, and said output terminal means of said flip-flop contains a set output terminal and a reset output terminal;
   said input gate means contains a first input gate connected to said set input terminal of said flip-flop and a second input gate connected to said reset terminal of said flip-flop; and
   said output buffer means contains a first output buffer with a first and second input terminals and a second output buffer with a first and second input terminals,
   said first input terminal of said first output buffer being connected to said set output terminal of said flip-flop that supplies a set signal to said first input terminal of said first output buffer, while said second input terminal of said first output buffer being connected to said output terminal of said second input gate that supplies a signal equivalent to a reset signal input to said reset input terminal of said flip-flop, and
   said first input terminal of said second output buffer being connected to said reset output terminal of said flip-flop that supplies a reset signal to said first input terminal of said second output buffer, with said second input terminal of said second output buffer being connected to said output terminal of said first input gate that supplies a signal equivalent to said set signal input to said set input terminal of said flip-flop.

3. A semiconductor integrated circuit according to claim 2, wherein each of said first and second output buffer means is composed of a NOR gate having at least two input terminals.

4. A semiconductor integrated circuit according to claim 1, wherein
   said input terminal means of said flip-flop contains a set input terminal and a reset input terminal, and said output terminal means of said flip-flop contains a set output terminal and a reset output terminal;
   said input gate means contains a first input gate connected to said set input terminal of said flip-flop, a second input gate connected to said reset terminal of said flip-flop, a third input gate having an output terminal, and fourth input gate having an output terminal; and
   said output buffer means contains a first output buffer with a first and second input terminals and a second output buffer with a first and second input terminal,
   said first input terminal of said first output buffer being connected to said set output terminal of said flip-flop that supplies a set signal to said first input terminal of said first output buffer, with said second input terminal of said first output buffer being connected to said output terminal of said fourth input gate that supplies a signal equivalent to said reset signal input to said reset input terminal of said flip-flop, and
   said first input terminal of said second output buffer being connected to said reset output terminal of said flip-flop that supplies a reset signal to said first input terminal of said second output buffer, with said second input terminal of said second output buffer being connected to said output terminal of said third input gate that supplies a signal equivalent to said set signal input to said set input terminal of said flip-flop.

5. A semiconductor integrated circuit comprising:
   a flip-flop having a set input terminal, a reset input terminal, a set output terminal and a reset output terminal;
   a first input gate connected to said set input terminal of said flip-flop to supply data to said input terminal of said flip-flop under the control of a first clock;
   a second input gate connected to said reset input terminal of said flip-flop to supply data to said input terminal of said flip-flop under the control of a second clock;
   a first output buffer connected to said set output terminal of said flip-flop to receive a signal from said output terminal of said flip-flop and also connected to said second input gate to receive a signal input to said reset input terminal of said flip-flop; and
   a second output buffer connected to said reset output terminal of said flip-flop to receive a signal from said output terminal of said flip-flop and connected to said first input gate to receive a signal input to said input terminal of said flip-flop.

6. A semiconductor integrated circuit comprising:
   a flip-flop having a set input terminal, a reset input terminal, a set output terminal and a reset output terminal;
   a first input gate connected to said set input terminal of said flip-flop to supply data to said set input terminal of said flip-flop under the control of a clock;
   a second input gate connected to said reset input terminal of said flip-flop to supply data to said reset input terminal of said flip-flop under the control of said clock;
   a third input gate that receives the same data as that supplied to said second input gate and supplies a specified data under the control of said clock;

a fourth input gate that receives the same data as that supplied to said first input gate and supplies a specified data under the control of said clock;

a first output buffer connected to said set output terminal of said flip-flop to receive a signal from said output terminal of said flip-flop and also connected to said third input gate to receive a signal equivalent to a signal at said reset input terminal of said flip-flop; and a second output buffer connected to said reset output terminal of said flip-flop to receive a signal from said output terminal of said flip-flop and connected to said fourth input gate to receive a signal equivalent to a signal at said set input terminal of said flip-flop.

7. A semiconductor integrated circuit comprising:

a flip-flop circuit for latching data with a data input terminal, a data output terminal, and a clock input terminal to which a first clock signal is supplied for holding data;

at least one input gate means connected to said data input terminal of said flip-flop to transfer data to said data input terminal of said flip-flop under the control of a second clock signal; and output buffer means with a first and second input terminals, said first input terminal of said buffer means being connected to said data output terminal of said flip-flop to receive a signal from said output terminal of said flip-flop, and said second input terminal of said output buffer means being connected to said input gate means to receive a signal equivalent to a signal supplied to said data input terminal of said flip-flop.

8. A semiconductor integrated circuit according to claim 7, wherein said flip-flop is composed of two NOR circuits, said input gate means is composed of one NOR circuit, and said output buffer means is composed of one NOR circuit.

9. A semiconductor integrated circuit according to claim 7, wherein said flip-flop is composed of two NAND circuits, said input gate means is composed of one NAND circuit, and said output buffer means is composed of one NAND circuit.

10. A semiconductor integrated circuit according to claim 7, wherein said flip-flop is composed of two NAND circuits, said output buffer means is composed of one NAND circuit, and said input gate means is composed of a CMOS transfer gate.

11. A semiconductor integrated circuit according to claim 7, wherein said flip-flop is composed of two NOR circuits, said output buffer means is composed of one NOR circuit, and said input gate means is composed of a CMOS transfer gate.

12. A semiconductor integrated circuit according to claim 7, wherein said input gate means includes a first input gate connected to said data input terminal of said flip-flop to transfer data to said input terminal of said flip-flop under the control of said second clock, and a second input gate connected to said output buffer means to transfer data to said buffer means under the control of a third clock.

13. A semiconductor integrated circuit according to claim 12, wherein said flip-flop is composed of two NOR circuits, said output buffer means is composed of one NOR circuit, and said input gate means is composed of one AND circuit.

* * * * *